United States Patent
Hamlin

(10) Patent No.: US 7,114,133 B2
(45) Date of Patent: Sep. 26, 2006

(54) BROKEN SYMMETRY FOR OPTIMIZATION OF RESOURCE FABRIC IN A SEA-OF-PLATFORM ARCHITECTURE

(75) Inventor: Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 227 days.

(21) Appl. No.: 10/809,939

(22) Filed: Mar. 25, 2004

(65) Prior Publication Data
US 2004/0221248 A1 Nov. 4, 2004

Related U.S. Application Data

(63) Continuation-in-part of application No. 10/626,825, filed on Jul. 23, 2003, now Pat. No. 7,058,906, which is a continuation-in-part of application No. 10/044,781, filed on Jan. 10, 2002, now Pat. No. 6,640,333, and a continuation-in-part of application No. 10/135,189, filed on Apr. 30, 2002, now abandoned.

(51) Int. Cl.
*G06F 17/50* (2006.01)
(52) U.S. Cl. .......................................... 716/3
(58) Field of Classification Search .............. 716/1–21; 700/96–98
See application file for complete search history.

(56) References Cited

U.S. PATENT DOCUMENTS

| | | | | |
|---|---|---|---|---|
| 4,656,592 A | | 4/1987 | Spaanenburg et al. ...... 364/490 |
| 5,581,738 A | * | 12/1996 | Dombrowski ................ 716/16 |
| 5,581,742 A | * | 12/1996 | Lin et al. ........................ 716/4 |
| 5,752,070 A | | 5/1998 | Martin et al. .......... 395/800.33 |
| 5,898,677 A | | 4/1999 | Deeley et al. .............. 370/276 |
| 5,940,393 A | | 8/1999 | Duree et al. ................. 370/392 |
| 6,152,613 A | | 11/2000 | Martin et al. .......... 395/800.33 |

(Continued)

FOREIGN PATENT DOCUMENTS

JP 01202397 1/2000

(Continued)

OTHER PUBLICATIONS

"On-Chip Networks Weighed a Wiring Alternative" by Ron Wilson, *Integrated System Design*, Jun. 25, 2001; www.eetimes.com; News Channels Design Automation; www.eedesign.com/article/printableArticle.jhtml?articleID=12805718; Jun. 30, 2004; 2 pages.

(Continued)

*Primary Examiner*—Paul Dinh
*Assistant Examiner*—Nghia M. Doan
(74) *Attorney, Agent, or Firm*—Suiter, West, Swantz PC LLO

(57) ABSTRACT

The present invention is directed to a method and system for optimally mapping a general set of resources to a specific integrated circuit design. In an exemplary aspect of the present invention, a method for optimally mapping a general set of resources to a specific integrated circuit design may include the following steps. Sets of transistors are first abstracted into abstracted resources. The abstracted resources may include a transformative resource, a coordinating resource, and a state management resource, and the like. Then, a sea-of-platforms is utilized for unifying a flexible and malleable collection of the abstracted resources in such a way as to optimize the abstracted resources for a specific integrated circuit design. Broken symmetry may be used to optimize the abstracted resources for the specific integrated circuit design. The broken symmetry may be in at least one of a physical 3-dimensional space, a temporal space and a code space.

18 Claims, 2 Drawing Sheets

U.S. PATENT DOCUMENTS

| | | | |
|---|---|---|---|
| 6,269,277 B1 | 7/2001 | Hershenson et al. | 700/97 |
| 6,370,677 B1* | 4/2002 | Carruthers et al. | 716/8 |
| 6,397,169 B1* | 5/2002 | Shenoy et al. | 703/14 |
| 6,496,508 B1 | 12/2002 | Breuckheimer et al. | 370/397 |
| 2003/0099254 A1* | 5/2003 | Richter | 370/466 |

FOREIGN PATENT DOCUMENTS

| | | |
|---|---|---|
| JP | 02202886 | 10/2001 |

OTHER PUBLICATIONS

Sony Computer Entertainment, Inc., IBM and Toshiba join to develop "supercomputer-on-a-chip" for the Broadband Era; Press Releases, 2 pages; Tokyo, Mar. 12, 2001.

Intel® XScale™ Microarchitecture: Product Brief; Copyright 2000 Intel Corporation; www.intel.com/design/intelxscale/bench.htm; 2 pages; Jun. 30, 2004.

"Self-Reconfigurable Programmable Logic Device" by Reetinder Sidhu, et al., File #3115; University of Southern California, Office of Technology Licensing, Los Angeles, CA., www.usc.edu/academe/otl; Sep. 7, 2001.

"Sea-of-IP: An Ocean of Design Possibilities", Royal Philips Electronics; Philips Semiconductor-Technology Home Pages; www.semiconductor.phiips.com/technology/sea-of-ip/index.html; Feb. 22, 2002; 3 pages.

"Tensilica Navigates 'Sea of Processors' Designs" by Chris Edwards; *Electronics Times*; Jun. 14, 2001; www.eetimes.com, News Channels Semiconductors; 3 pages.

* cited by examiner

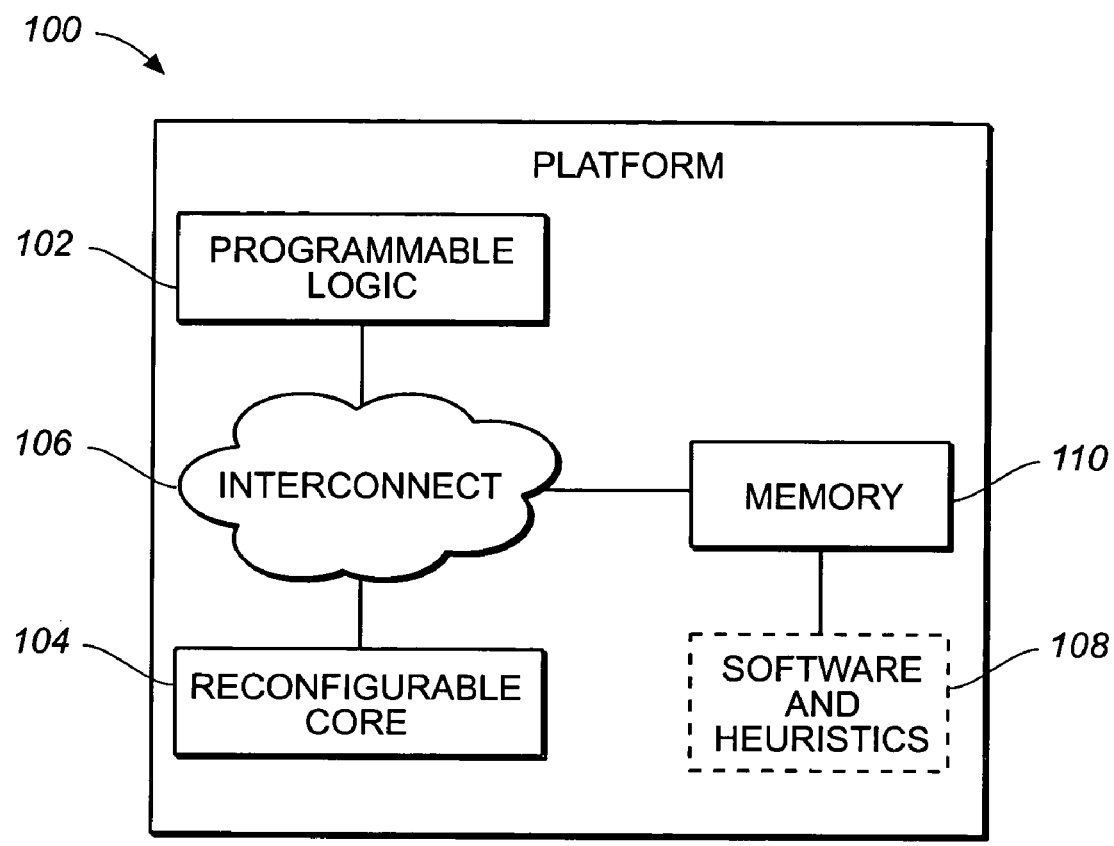
FIG._1

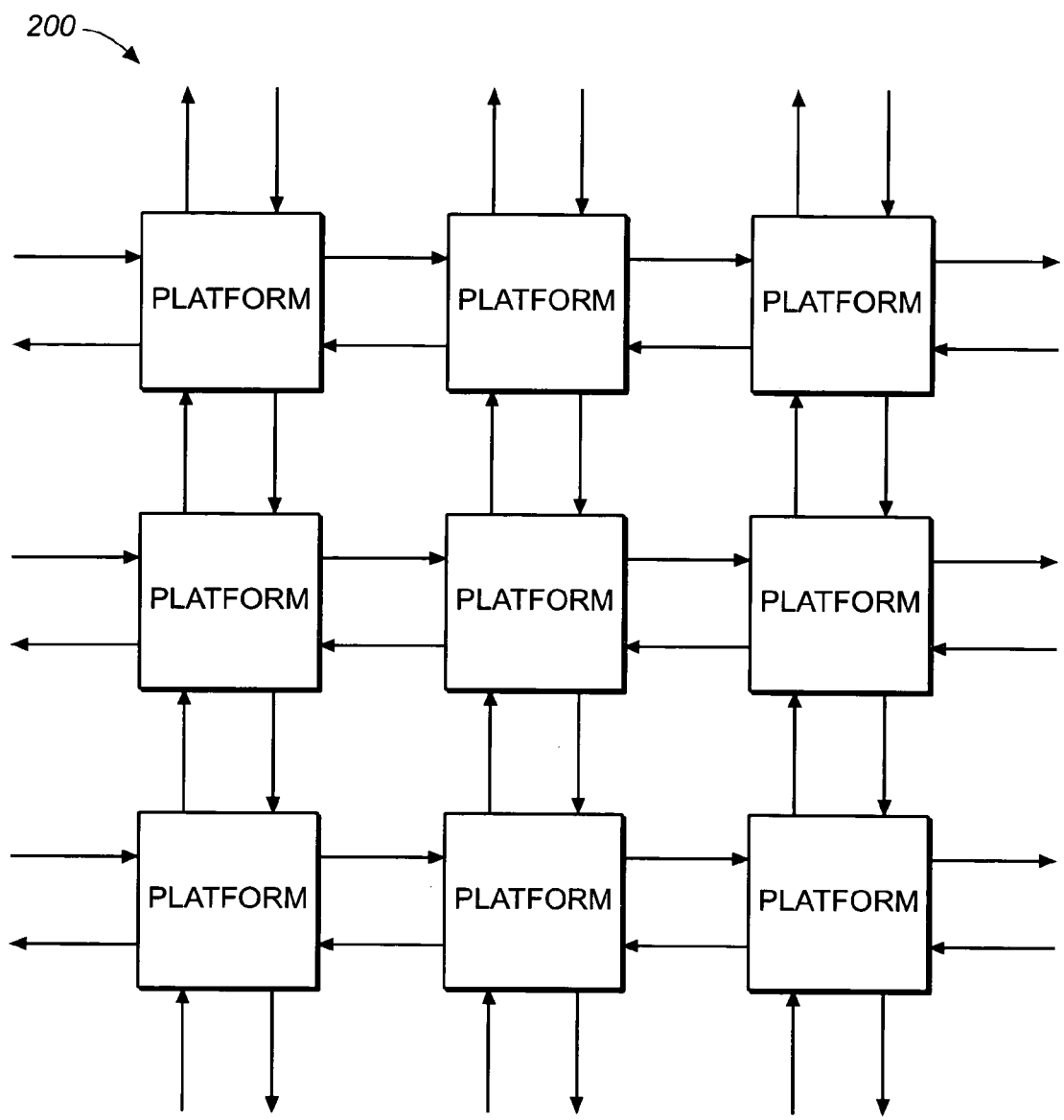
FIG._2

BROKEN SYMMETRY FOR OPTIMIZATION OF RESOURCE FABRIC IN A SEA-OF-PLATFORM ARCHITECTURE

CROSS REFERENCE TO RELATED APPLICATIONS

The present application is a continuation-in-part of U.S. patent application Ser. No. 10/626,825, entitled "Architecture for a Sea of Platforms", filed Jul. 23, 2003, now U.S. Pat. No. 7,058,906, which in turn is both a continuation-in-part of U.S. patent application Ser. No. 10/044,781, entitled "Architecture for a Sea of Platforms", filed Jan. 10, 2002, now U.S. Pat. No. 6,640,333, and a continuation-in-part of U.S. patent application Ser. No. 10/135,189, entitled "Extended Instruction Sets in a Platform Architecture", filed Apr. 30, 2002, now abandoned.

The present application herein incorporates all of the above-identified U.S. patent applications and Patents by reference in their entirety. The present application herein incorporates U.S. patent application Ser. No. 10/764,803, entitled "Field Programmable Platform Array", filed Jan. 26, 2004 by reference in its entirety.

FIELD OF THE INVENTION

The present invention relates generally to the field of integrated circuit design, and particularly to a method and system for optimally mapping a general set of resources to a specific integrated circuit design.

BACKGROUND OF THE INVENTION

Integrated circuits have become a necessary part of everyday modern society. From wireless phones and information handling systems, to household appliances and data storage systems, a wide range of integrated circuits are utilized to provide a broad range of functionality. To provide this functionality, integrated circuits may need to be specialized to have the functions necessary to achieve the desired results, such as through the provision of an application specific integrated circuit (ASIC). An ASIC is typically optimized for a given function set, thereby enabling the circuit to perform the functions in an optimized manner. However, there may be a wide variety of end-users desiring such targeted functionality, with each user desiring different functionality for different uses.

Additionally, more and more functions are being included within each integrated circuit. While providing a semiconductor device that includes a greater range of functions supported by the device, inclusion of this range further complicates the design and increases the complexity of the manufacturing process. Further, such targeted functionality may render the device suitable for a narrow range of consumers, thereby at least partially removing an "economy of scale" effect that may be realized by selling greater quantities of the device.

Thus, the application specific integrated circuit business is confronted by the contradiction that the costs of design and manufacture dictate high volumes of complex designs. Because of this, the number of companies fielding such custom designs is dwindling in the face of those rapidly escalating costs.

Therefore, it would be desirable to provide a method and system for optimally mapping a general set of resources to a specific integrated circuit design, which may decrease integrated circuit design cost and increase integrated circuit design efficiency.

SUMMARY OF THE INVENTION

Accordingly, the present invention is directed to a method and system for optimally mapping a general set of resources to a specific integrated circuit design. In an exemplary aspect of the present invention, a method for optimally mapping a general set of resources to a specific integrated circuit design may include the following steps. Sets of transistors are first abstracted into abstracted resources. The abstracted resources may include a transformative resource, a coordinating resource, and a state management resource, and the like. Then, a sea-of-platforms is utilized for unifying a flexible and malleable collection of the abstracted resources in such a way as to optimize the abstracted resources for a specific integrated circuit design. Broken symmetry may be used to optimize the abstracted resources for the specific integrated circuit design. The broken symmetry may be in at least one of a physical 3-dimensional space, a temporal space and a code space.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an illustration of an embodiment of the present invention wherein a platform operable to embody the present invention is shown; and FIG. 2 is an illustration of an embodiment of the present invention wherein a plurality of platforms as shown in FIG. 1 is provided in a fabric;

DETAILED DESCRIPTION OF THE INVENTION

Reference will now be made in detail to the presently preferred embodiments of the invention, examples of which are illustrated in the accompanying drawings.

Referring generally now to FIGS. 1 through 2, exemplary embodiments of the present invention are shown. The present invention provides an architecture for an element for use as a design component in application specific integrated circuit (ASIC) or semiconductor design. Technical questions involving complex device design may be thought of in two general areas, metamethodology and platform architecture. Metamethodology is a formal organizing architecture for defining and managing arbitrary semiconductor design flows in predictable, efficient ways, which may be tailored to specific product and process characteristics. For instance, different flows may have different combinations of tools in them, and thus, the successful operations may require the imposition of automated rule-based assessment of progress and error in order to allow designers to work productively at a higher level of abstraction than is typical today.

As semiconductor design progresses along the deep sub-micron roadmap, and as the challenge of managing complexity becomes ever greater, the need to define building blocks of designs at higher levels of abstraction becomes even more pressing. Such a higher-level building block includes a "platform."

Referring now to FIG. 1, an embodiment 100 of the present invention is shown wherein elements of an exemplary platform are provided. A platform may include a combination of the following elements: (1) embedded programmable logic 102, which in some contemplated embodiments is analogous to field programmable gate array (FPGA) or complex programmable logic device (CPLD) cores that FPGA companies sell as complete devices; (2) reconfigurable cores 104 such as a fundamental processor element to which instruction-specialized, application-specific instruction set extensions may be added; (3) an advanced interconnect 106, which in contemplated embodiments is scalable, and may be isochronous; (4) software models and heuristics 108; and (5) specialized memories 110, which may include nonvolatile structures like MRAM, which is a memory that is based on the magneto resistive effect, as well as other memories as contemplated by a person of ordinary skill in the art. Specialized one-time programmable flash memory may also be included.

Programmable logic 102 components may include blocks of programmable gate arrays, "seas of adders", CPLD structures, and other suitable programmable circuit elements definable from a stored representation, either at power-on, dynamically while in operation, and the like.

Reconfigurable cores 104 may include a base processor design, plus instruction set extensions designed to carry out function-specific logical and arithmetic operations with optimal efficiency. For instance, such reconfigurable cores may implement digital signal processing instruction set enhancements.

An interconnect 106 architecture is provided to allow the programmable logic and the reconfigurable cores to communicate with one another and with associated memory blocks. Such an architecture may define a transport which is scalable in bandwidth and is inherently isochronous. Further, it may be realizable within a switching fabric, which permits complex, adaptive, interconnect and access paths to be defined on the fly. Isochrony, through a universal time base, may simplify the problems of closing timing in complex designs.

The software for the platform may include the development environment and its interface to the metamethodology, as well as software IP cores, which may be implemented on the platform components, and the customer-developed custom code implementing proprietary or functionally specific routines.

There are numerous ways of structuring logic blocks: such as the number of logic elements in an organization; the kinds of cores and the numbers of cores; whether or not DSP-specific characteristics are included, and the like. Additionally, the characteristics of the interconnect, software, and memory may all be varied in innumerable different ways without departing from the spirit and scope of the present invention.

When a collection of electronic resources including digital circuits, processors, analog circuits, and the like is integrated by means of an interconnection network with regular or partially regular structure, it is termed a fabric. A particular type of fabric in which each node comprises an instance of a "platform" is termed a "sea of platforms".

Of particular importance in a sea of platforms is the signaling discipline whereby the elements in the fabric are clocked and are coordinated in time. In traditional practice, for instance, a regular digital clock pulse is supplied to each element, and the edges of the clock(s) are aligned locally using PLLs (Phase Lock Loops) or DLLs (Delay Lock Loops), for example.

In a sea of platforms architecture the physical resources are abstracted to a considerable extent from the explicit function(s) they will be called upon to implement. In the same fashion it is desirable to abstract as far as possible the timing resources which the nodes in the sea of platforms fabric rely upon, in the interests of efficiency and reliability.

In the sea of platforms architecture, the present invention proposes implementing a plesiochronous signaling discipline by means of which every interconnected element in the sea of platforms is provided with just the timing resources necessary to accomplish its task, but no more. In other words, excess accuracy or precision in the provision of timing resources to a node or unit in the fabric is undesirable because it allocates energy or physical components unnecessarily and therefore inefficiently to the instantaneous timing requirements of the unit.

Under the present invention, a protocol is used to establish a pre-defined "local regime" for timing purposes, in terms of which the node in question will conduct its operations. It may vary with respect to the activities being conducted simultaneously in other nodes, to explicit degrees which are asserted by the protocol. At any time, the node may request or may be required to establish a new degree of coordination or synchronization with other members of the fabric, under the control of the protocol conveyed to the nodes in question.

Such signaling, which differs, for example, from jitter management schemes, falls broadly under the classification of plesiochronous architectures. Its central advantage in the sea of platforms case is that timing may be permitted to vary freely with respect to precision and accuracy where appropriate within the fabric, but may at any point be coordinated or synchronized with external entities whose state has arrived at a requirement for the re-imposition of a greater degree of accuracy or precision.

Such a plesiochronous sea of platforms depends upon having access to a universal timebase and set of clocking resources which can be sampled and parceled out via the protocol as needed to the participating nodes; the specific uses of the protocol may be programmatic or algorithmic, and can answer both deterministic and stochastic process requirements as they arise within the sea of platforms.

The present invention provides a platform, which may be embedded in a methodological framework that allows designers to work with the platform at a high level of abstraction. The complexity of the interactions between elements may be so great that by providing abstractions, the interactions may be rendered manageable and tractable for designers that will use them practically.

Referring now to FIG. 2, an embodiment 200 of the present invention is shown wherein an architecture is configured as a sea of platforms. In this embodiment, a fabric is shown including a plurality of platforms. Preferably, the platforms are connected utilizing similar protocols, interconnect technology and interconnect architecture to unify the platforms in a single fabric.

Thus, a structure of the resources may be provided including the memory, reconfigurable cores, embedded programmable blocks, software and interconnect, which communicates and intercommunicates coherently on an isochronous fabric. Such a structure may be suitable for providing a "programmable ASIC". For instance, an application-neutral device may be constructed with potential for accepting complex logic and definitions that are programmed completely independently of the fabrication of the device. This may be thought of as a decoupled model, in which the contemplated implementation of the device as used by an end-user is decoupled from the process of designing and manufacturing the physical device itself.

Each of these intersections on this fabric, may contain one or more processors, embedded programmable logic, memory, software capabilities and its own interconnect internally, as described in relation to FIG. 1. By providing this fabric including these reconfigurable cores, the present invention may provide a targeted semiconductor providing desired functionality without requiring specialized design and manufacturing processes as previously required in ASIC manufacture.

For example, a manufacturer may receive a register transfer level (RTL) definition of a solution to a problem from a customer for a specification. A customer may want to create, for instance, a communications device, a storage device, a controller, a switching product, a game controller for consumer application, a satellite TV set-up box, and the like, and supply an RTL specification for the desired device to the manufacturer.

By utilizing the present invention, the RTL may be mapped into the platform of the present invention to provide the desired functionality as indicated by the RTL. For instance, instruction set architecture extensions may be utilized for mapping to the reconfigurable core the desired functionality. The extensions may be crafted to solve efficiently and specifically problems in encryption, in encoding or decoding, in modulation, in signal processing, in data transformation of various kinds, and the like. Additionally, abstract logic functions may be implemented, such as specialized shift registers, multiplexers (MUX), and the like as contemplated by a person of ordinary skill in the art. Thus, an instruction set extension may be affiliated with a wide range of functionality.

An embedded programmable logic core (EPLC) block may be tied to a set of instruction set extensions such that the EPLC block would have responsibility under software control for invoking any of several extensions to be active in a particular temporal episode. In this way, the "personality" of a reconfigurable core may be changed dynamically under the control of this EPLC mechanism. Thus, in an aspect of the present invention, this may enable the mapping of an RTL efficiently into a sea of platforms. The constituents of one platform may allow an EPLC block to play a role when choosing appropriate instruction set extensions as needed, given the temporal evolution of the function that the block is fulfilling.

Isochronous Functionality

Referring again to FIG. 2, by providing an isochronous fabric, the register files of multiple processors in multiple platforms may be utilized as dynamically extensible. In other words, it is possible because of the isochronous characteristic of the fabric, without additional software or additional overhead, to synchronize and coordinate the instruction-set extension operations on these register files over as many platforms as needed, which may be thought of as extending horizontally across the fabric as desired to achieve the necessary resources, such as processor power and the like, to fulfill a particular complex logic function.

Arbitrary sets of logic functions may be deployed across register files, and the instruction set extensions treated as general logic engines that are reconfigurable "on-the-fly," on a cycle-by-cycle basis. For instance, given, (a), the provision of a proper instruction set extension or extensions to coordinate discrete, distinctive, different instruction set extensions on a cycle-by-cycle basis; and (b), that the execution is synchronized, for instance, to ensure that the right instruction set extension is invoked in the right set of reconfigurable cores at the right cycle, the functions may be deployed across platforms, operating as logic engines, as needed. Thus, by knowing the functionality of a register, where that functionality is located, and the function of a register at a given point in time, logic functions may be targeted to provide the functionality.

For example, in terms of actual behavior of applications in the real world, loads vary, and functions vary as loads vary. By utilizing the present invention, spatial distribution of functions across the array may vary as a function of the dynamic changes in the functional load that is actually being asked of a particular device.

To track these changes and provide the functionality, a map may be maintained indicating the functionality of the platforms. For instance, in an aspect of the present invention, a master map is maintained of the instantaneous distribution of functions across the platforms. Such a map may be thought of as a functional virtualization, in which the map indicating corresponding functions and locations is fully virtualized. Thus, functional virtualization may be provided in addition to a general logic capability previously discussed.

Because the isochronous foundation of this embodiment of the present invention, the isochronous fabric provides coordination synchronization without the bookkeeping or overhead which may be associated utilizing other methods. By providing a mapping of particular components, i.e. what the particular components are set up to do what particular component of a function at what point in time, desired functionality may be achieved in a coordinated fashion.

Compiler

In an additional aspect of the present invention, a smart compiler is provided which "understands" how to manage and develop a binary executable for a particular instruction set extension. Further, the compiler technology may be generalized so that it has the property of extending this understanding, so that it may track which extensions are mapped to which particular set of processors, and understands temporally the load value, i.e. the cycle by cycle availability of a resource of a particular kind.

In effect, the compiler technology extends horizontally across processor function sets, so that the compiler, when an application, methodology and like program of instructions is expressed and translated to the compiler, the compiler may determine availability of the resources. Additionally, through the use of an isochronous fabric, there is no overhead associated with altering the connections. Reconfiguring the functionality of a device employing the platforms may be accomplished through changing the map.

The compiler technology of the present invention may implement this space/time view through an arbitrarily extensible very large instruction word (VLIW) architecture that is variable. For example, although the architecture has been used in multimedia engines, the width is cycle-by-cycle variable according to this aspect of the present invention.

The advantages of such a "smart" compiler are numerous. For instance, in cache management, a variety of considerations may be accounted for, such as latency and the resultant performance penalty, associated overhead of flushing the cache versus maintaining a function in place, and the like. Thus, a compiler of the present invention may optimize operations performed by the platforms.

Therefore, in an embodiment of the present invention, a compiler is provided that is capable of maintaining space/time mapping of the instruction set extensions over an isochronous fabric so that cycle-by-cycle ability is maintained to affiliate objects and communicatively couple them as desired.

Mapping

To coordinate and provide desired functionality, a map of the present invention is provided. For instance, in an aspect of the present invention, RTL is expressed, in terms of combinations of instruction set architecture extensions and embedded programmable logic core (EPLC) blocks.

For example, in an aspect of the present invention, a map is provided for describing functions of platforms of the present invention expressed in a graph-theoretic manner. A map may be provided as a graph, for instance, employing graph coloring and with efficient graph-traversal algorithms to describe the interaction and functionality of the components.

Formalisms may be employed for expressing functions, such as MUXs, latches, codecs, and like logic functions and re-expressing the functions in terms of efficient instruction set architecture (ISA) extensions. Preferably, the extensions take into account that some components of the ISA may be modified on a cycle-by-cycle basis on the one hand and may be varied in width on the other hand.

For instance, standard library functions, such as concrete, practical, standard functions in an ASIC, may be expressed as mathematical abstracts. These mathematical abstracts may be expressed as instruction set extensions and EPLC adjuncts that will allow these instructions to be manipulated rapidly. In one contemplated embodiment, ASIC library functions are implemented with minimal overhead penalties and space penalties.

In this way, the present invention provides two degrees of freedom in finding optimal expressions of logic functions that can be deployed across the sea of platforms of the present invention.

Resource Fabric and Broken Symmetry

The use of a switched fabric to implement a "sea-of-platforms" architecture has been described above. This section describes a "resource fabric", which might preferably be based upon a "sea-of-platforms" such as described above, and whose preferred embodiment entails the use of "broken symmetry" in the optimization of the fabric characteristics.

Semiconductor devices may be thought of as converting collections of transistors into functions. This may be achieved by ordering logic operations and state transitions in time in a manner which accomplishes a sought-after operation on data. As it has become possible to manufacture devices with more and more transistors, the functions implemented have become more complex and diverse. This evolution has been accompanied by an attendant increase in the complexity of the pattern of connections between groups of transistors on devices, and also by a tendency to group larger and larger sets of transistors according to abstractions operating at higher and higher levels. Thus functions become available to designers in abstracted forms which make it unnecessary to know how a particular grouping of transistors is organized to implement the function.

As devices approach the one billion transistor level of complexity, it is desirable to accompany this growth with a suitable extension of the level of abstraction employed to efficiently gather together groups of transistors which accomplish a useful, abstracted purpose which designers can readily incorporate into larger design structures.

To this end, the present invention pertains to a new level of abstraction in terms of which groupings of transistors on a semiconductor device may be organized, which extends the level of abstraction from a "function" to a "resource". Furthermore, it details the implementation of such abstracted resources within a "resource fabric" which might be realized in a number of ways, but whose preferred manner of implementation is a fabric characterized by "broken symmetry" in any of the dimensions of a) physical 3-dimensional space; b) temporal space; or c) code space. These concepts are further elaborated below.

The economics of manufacturing very high complexity devices increasingly favor the reuse of physical assets on a die wherever possible, because the fixed costs of factors of production such as mask sets is rising nearly exponentially in some cases.

As a result, just as it proved fruitful in standard cell ASIC design to abstract sets of transistors into functional groups implementing specific tasks such as decoding, de-serialization or filtering, the present invention contemplates the further abstraction of sets of transistors and sub-functions into "resources", which may be combined in specific ways to achieve certain functional objectives.

As an illustration of the further abstraction of sets of transistors into "resources" (though not an exhaustive one) the elements of a high complexity device could be thought of as falling into any of three categories: Transformative, Coordinating, and State Management.

Notice that none of these three categories is an end function proper; rather these are abstracted descriptions of resource types needed by various different functional tasks. Under the heading Transformative Resources might fall Conversion and Translation of data, Modulation, Calculation, Coding and Decoding, and so on. Under the heading of Coordinating Resources might fall Timing, Synchronization, Buffering, Caching, and so on. State Management Resources might include control of non-volatile storage structures, tree traversal capabilities, and so on.

The elevation of the level of abstraction applied to sets of resources in this manner requires a suitably flexible, malleable strategy for interconnecting the resources so that they may be fashioned into the arrangements which best satisfy an ultimate functional objective. The structure described in the aforementioned "sea-of-platforms" disclosure is appropriate for this purpose, if extended in the manner now to be described.

One of the goals of device architecture is to maximize the efficiency with which a general semiconductor organization which minimizes manufacturing cost can translate a specific customer design into product form. Device organizations span a continuum from extremely specific, which are suitable for very high volume, cost sensitive applications, to very general (illustrated by FPGAs) which match cost insensitive low volume markets.

The ideal device architecture is one in which a very high degree of generality is sustained (thereby lowering manufacturing and inventory cost and risk) without sacrificing efficiency in accommodating a large range of specific product designs.

Hence the present invention employs the sea-of-platforms as a vehicle for unifying a flexible and malleable collection of abstracted resources in such a way as to optimize their use for specific designs.

A progression may be proposed whereby the fabric structures evolve over time (perhaps through the 65 nm node), according to the following sequence:

1) regular matrix, asynchronous signaling;
2) regular matrix, isochronous signaling;
3) 'perturbed' matrix, plesiochronous signaling;

4) multidimensional symmetry-breaking matrix (encompassing the dimensions of physical space, temporality, and code space)

In each instance the fabric represents a set of interconnects between nodes, each node comprising a set of resources. The important feature of the present invention is that the need for efficiency in mapping between a very general organization and very specific applications is satisfied because the sea-of-platforms set of resources is freed from fixity in physical placement and from fixity with respect to time, in the sense that it becomes possible to schedule consumption of resources throughout the fabric, and to incorporate such schedules into the design environment which is used to translate specific designs into the resource fabric.

The efficiency of this mapping ultimately resolves to selection of a device family member with just sufficient spatial and temporal resources to meet the requirements of a design; the fit between the specific design and the fabric-based resource set is optimized through the placement and scheduling operations.

In effect this efficiency optimization may be thought of as an extension of conventional place-and-route operations, which are applied in two-dimensional space to the physical matrix of transistors on a device, to a higher dimensional abstract space in which time is also available for "placement", except that in the case of time the resource consumption takes the form of scheduling. But from an abstract point of view the result is the same: an asset is consumed, or "placed", with respect to all other assets in the device, in satisfaction of the design's specific requirements.

The problem of inferring that structure which will optimally map a general set of resources to a specific product design with minimal inefficiency is of the sort called "inverse". The present invention applies a property called "broken symmetry" to this inverse problem. Broken symmetry arises in many contexts with similar properties, in that neither perfectly regular structures such as rectilinear Cartesian coordinate systems, nor highly irregular structures such as the random-seeming patterns emerging from genetic programming solutions, offer the optimal balance for reconciling the specific with the general. Broken symmetry operates to balance the competing demands of specific designs and general resource sets on the physical and temporal resources of a device's architecture.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for optimally mapping a general set of resources to a specific integrated circuit design, comprising steps of:
    abstracting sets of transistors into abstracted resources, said abstracted resources including at least one of a transformative resource, a coordinating resource, and a state management resource; and
    utilizing a sea-of-platforms for unifying a collection of said abstracted resources in such a way as to optimize said abstracted resources for a specific integrated circuit design, said abstracted resources configured for being fashioned into multiple arrangements,
    wherein said utilizing step comprises implementing a plesiochronous signaling discipline in said sea-of-platforms, said plesiochronous signaling discipline providing just necessary timing resources for achieving a particular task, the particular task being at least one of decoding, de-serialization, and filtering.

2. The method of claim 1, wherein said transformative resource includes at least one of conversion and translation of data, modulation, calculation, and coding and decoding.

3. The method of claim 1, wherein said coordinating resource includes at least one of timing, synchronization, buffering, and caching.

4. The method of claim 1, wherein said state management resource includes at least one of control of non-volatile storage structures, and tree traversal capabilities.

5. The method of claim 1, wherein said utilizing step comprises using broken symmetry to optimize said abstracted resources for said specific integrated circuit design.

6. The method of claim 5, wherein said broken symmetry is in at least one of a physical 3-dimensional space, a temporal space and a code space.

7. A system for optimally mapping a general set of resources to a specific integrated circuit design, comprising:
    means for abstracting sets of transistors into abstracted resources, said abstracted resources including at least one of a transformative resource, a coordinating resource, and a state management resource; and
    means for utilizing a sea-of-platforms for unifying a collection of said abstracted resources in such a way as to optimize said abstracted resources for a specific integrated circuit design, said abstracted resources configured for being fashioned into multiple arrangements,
    wherein said utilizing means comprises means for implementing a plesiochronous signaling discipline in said sea-of-platforms, said plesiochronous signaling discipline providing just necessary timing resources for achieving a particular task, the particular task being at least one of decoding, de-serialization, and filtering.

8. The system of claim 7, wherein said transformative resource includes at least one of conversion and translation of data, modulation, calculation, and coding and decoding.

9. The system of claim 7, wherein said coordinating resource includes at least one of timing, synchronization, buffering, and caching.

10. The system of claim 7, wherein said state management resource includes at least one of control of non-volatile storage structures, and tree traversal capabilities.

11. The system of claim 7, wherein said utilizing step comprises means for using broken symmetry to optimize said abstracted resources for said specific integrated circuit design.

12. The system of claim 11, wherein said broken symmetry is in at least one of a physical 3-dimensional space, a temporal space and a code space.

13. A computer-readable medium having computer-executable instructions for performing a method for optimally mapping a general set of resources to a specific integrated circuit design, said method comprising steps of:
abstracting sets of transistors into abstracted resources, said abstracted resources including at least one of a transformative resource, a coordinating resource, and a state management resource; and
utilizing a sea-of-platforms for unifying a collection of said abstracted resources in such a way as to optimize said abstracted resources for a specific integrated circuit design, said abstracted resources configured for being fashioned into multiple arrangements,
wherein said utilizing step comprises implementing a plesiochronous signaling discipline in said sea-of-platforms, said plesiochronous signaling discipline providing just necessary timing resources for achieving a particular task, the particular task being at least one of decoding, de-serialization, and filtering.

14. The computer-readable medium of claim 13, wherein said transformative resource includes at least one of conversion and translation of data, modulation, calculation, and coding and decoding.

15. The computer-readable medium of claim 13, wherein said coordinating resource includes at least one of timing, synchronization, buffering, and caching.

16. The computer-readable medium of claim 13,
wherein said state management resource includes at least one of control of non-volatile storage structures, and tree traversal capabilities.

17. The computer-readable medium of claim 13, wherein said utilizing step comprises using broken symmetry to optimize said abstracted resources for said specific integrated circuit design.

18. The computer-readable medium of claim 17, wherein said broken symmetry is in at least one of a physical 3-dimensional space, a temporal space and a code space.

* * * * *